Oct. 20, 1964 R. F. BEEBE 3,153,730

PULSE FORMING NETWORK

Filed Feb. 5, 1962

INVENTOR

Ronald F. Beebe,

BY Alfred B. Levine

ATTORNEYS

United States Patent Office 3,153,730

Patented Oct. 20, 1964

3,153,730

PULSE FORMING NETWORK

Ronald F. Beebe, Hyattsville, Md., assignor to Litton Systems, Inc., College Park, Md.

Filed Feb. 5, 1962, Ser. No. 171,053
7 Claims. (Cl. 307—88.5)

Figure 1:
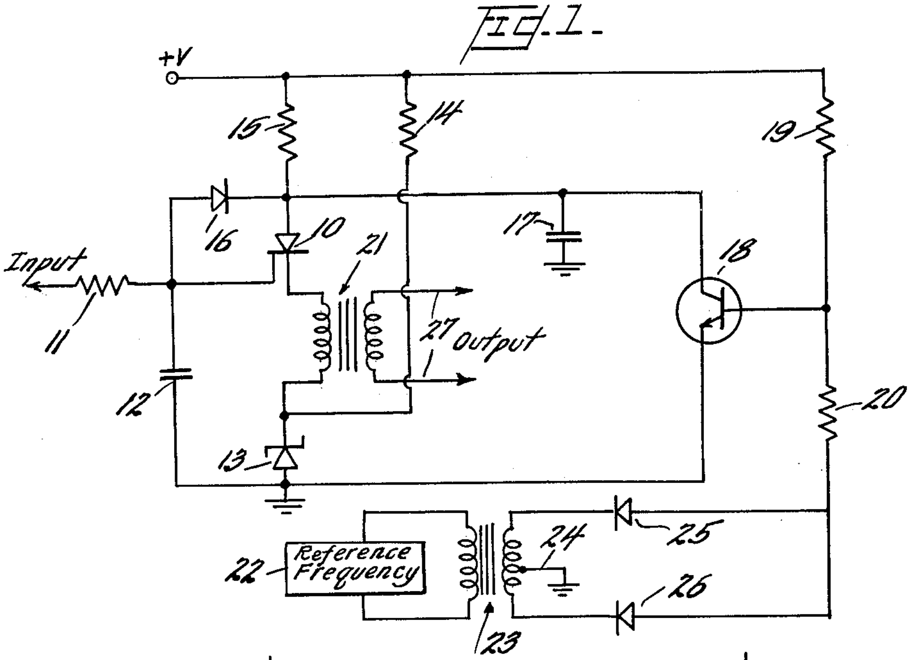

This invention generally relates to improvements in firing circuits for silicon control rectifiers and other solid state power handling devices and is particularly concerned with providing firing circuits that are small, lightweight and temperature insensitive yet capable of providing time regulation of the firing cycle over a wide range responsively to a voltage control signal.

In the past it has been customary to employ unijunction transistor circuitry or magnetic amplifier circuitry for regulating the firing angle of silicon control rectifiers or like solid state power control devices. However, the unijunction transistor circuitry is not completely satisfactory since the unijunction transistor components as presently available are both temperature sensitive and not manufactured with uniform characteristics whereby the circuits must be individually adjusted to accommodate these different characteristics and cannot be readily produced in quantity. Additionally, it is usually necessary to provide pulse amplifiers since the amplitude of the firing pulses that can be obtained are not adequate to trigger the silicon control rectifiers over a wide range of different firing angles.

The magnetic amplifier circuits on the other hand are relatively long time constant circuits and cannot be used for fast acting pulse control systems. Moreover, the magnetic amplifier circuits, as presently available, are both larger and heavier than is desired and are not easily adaptable for use in equipments which size and weight must be minimized.

According to the present invention, there is provided an improved voltage controlled firing circuit that is comprised exclusively of solid state components that are both small, lightweight, fact acting and relatively insensitive to temperature and other variables. The firing of the rectifier is accurately controlled by producing a substantially sawtooth or ramp shaped wave-form that is proportional in slope to the amplitude of the input control signal and therefore capable of accurately firing the rectifier at a time instant accurately proportional to this amplitude. The extinguishing of the rectifier is also accurately controlled in time by means of an automatically operating switching circuit referenced in time to the cycles of a constant frequency alternating current source. Furthermore after each cycle of the A.C. reference wave, the circuitry is automatically reset to its initial condition whereby the response of the overall circuit is as rapid as one cycle of the reference A.C. wave.

It is accordingly a principal object of the invention to provide an improved voltage controlled variable firing circuit for solid state power rectifiers capable of providing precise control of the flow of power through the rectifier over a wide range of adjustment.

A further object is to provide such a circuit capable of regulation over a wide range of about zero to 165 degrees of an alternating current source.

Still another object is to provide such a circuit that is comprised of solid state components and relatively insensitive to variations of temperature.

Figure 2:
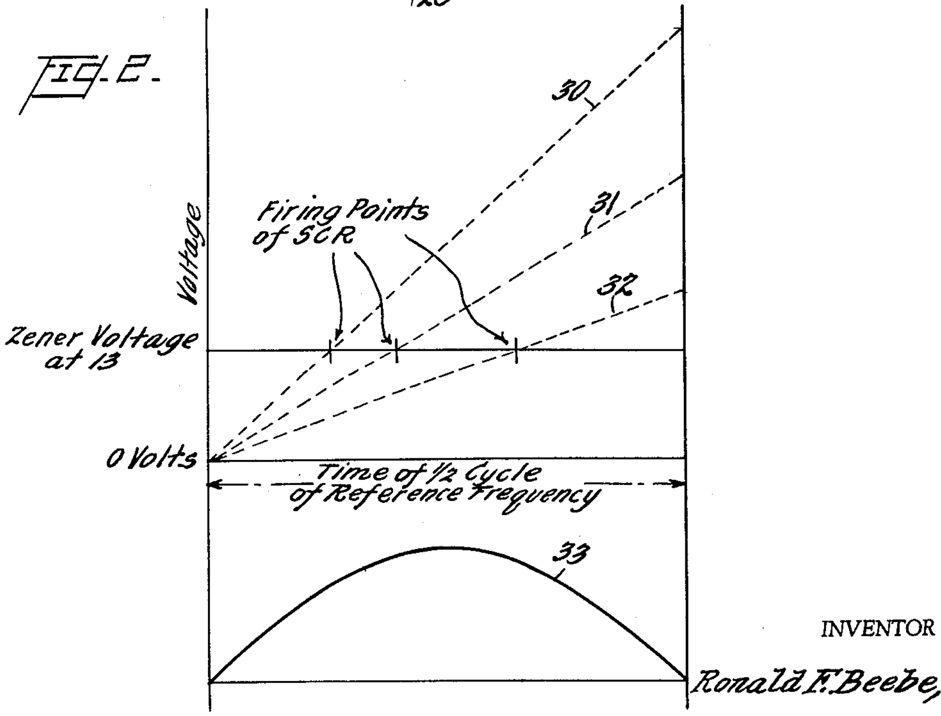

Other objects and many additional advantages will be more readily understood by those skilled in the art after a detailed consideration of the following specification taken with the accompanying drawing wherein:

FIG. 1 is an electrial schematic diagram of one preferred embodiment of the invention, and FIG. 2 is a timing diagram for illustrating the functioning of the preferred circuit.

Referring now to FIG. 1 for a detailed consideration of the invention, the pulse producing circuitry preferably comprises a solid state controlled rectifier 10, of the type known as a silicon control rectifier, having a pair of power controlling electrodes connected in series with the primary winding of a pulsing output transformer 21, whose secondary winding is connected to output terminals 27 for directing a power pulse to a load (not shown), which may be a high power silicon control rectifier or the like. According to the present invention there is provided an improved time control circuit for regulating the firing interval of this rectifier 10 during each half or full cycle of an alternating wave, such as wave 33 in FIG. 2, in response to the amplitude of a signal input voltage being applied to the input terminal of the circuit.

The input control signal is directed through resistance 11 and capacitance 12, disposed in a series connected resistance-capacitance charging circuit having a comparatively long time constant referenced to each cycle 33 of an alternating current wave. Consequently, upon the application of the voltage signal to the input, the capacitance 12 is charged in a substantially linear fashion to provide a progressively increasing ramp voltage across the capacitor 12, as indicated by each different one of the waveforms 30, 31, or 32 in FIG. 2. This ramp voltage is directed to the control electrode of the silicon control rectifier 10, as shown, whereby when the voltage at the control electrode exceeds the voltage present on the cathode of the rectifier, the rectifier is triggered into a conducting condition enabling current flow through the power handling electrodes from the anode to the cathode and thence through the output pulsing transformer 21.

To provide a substantially fixed bias potential at the cathode of the rectifier 10, there is inserted in series with the rectifier 10 and transformer 21, a Zener diode 13. As is well known, a diode operating in the Zener region possesses a substantially fixed breakdown potential and consequently maintains a fixed and stabilizing biasing potential thereacross when it is energized into this breakdown region. A resistor 14 connected in series with the Zener diode and being energized by the power line, as shown, provides this necessary breakdown potential whereby the voltage across diode 13 to ground supplies the desired bias to the cathode electrode of the rectifier 10.

As thus far described therefore, whenever the voltage charge across the input capacitance 12 exceeds the bias voltage across the Zener diode 13, the rectifier 10 is triggered into conducting condition permitting current flow to the output pulsing transformer 21. This firing condition is illustrated in FIG. 2 for three different amplitudes of input signal voltage, 30, 31, and 32 being applied to the input line. As is noted in the examples of FIG. 2, when the amplitude of the input control voltage is greatest, the linear voltage buildup or charge across capacitor 12 is at the most rapid rate, illustrated by dotted line 30, and reaches the fixed bias Zener voltage at the earliest time during the cycle of the reference frequency 33. Consequently the rectifier 10 is triggered into conduction early during the cycle, of the reference frequency 33 and remains conducting during the remainder of this cycle. Should the input control voltage be at a lower amplitude, the voltage charge across capacitor 12 is accumulated at a lower rate, as shown by the linear ramp voltage 31; and in this case, as shown, the input voltage to the control electrode of rectifier 10 does not reach the bias voltage until a later time instant during the cycle. Consequently the rectifier 10 does not fire until later on in the cycle of the alternating current cycle 33. In a similar manner as described, it can be shown that the time of firing the rectifier 10 during each cycle can be accurately regulated according to the amplitude of the input signal voltage over a range of about 0° to 165° of the A.C. wave, thereby accurately controlling the power flow to the load over a range of full "on" condition to substantially full "off" condition, as is desired.

To extinguish conduction of the rectifier 10 at the termination of each cycle of the pulsating direct current wave 33, there is provided a periodically operating switch 18 for repetitively short circuiting the power terminals of the rectifier 10 at the end of each cycle. As shown, this switch preferably comprises a switching transistor 18 having its collector electrode connected to the anode of rectifier 10 and its emitter electrode connected to ground. The base electrode of transistor 18 is adapted to be energized by a pulsating direct current source provided by a full or half wave rectifying circuit to be described, whereby the transistor 18 is triggered into conducting condition at the end of each cycle of the pulsating wave 33.

More specifically, the rectifier circuit preferably comprises a transformer 23 energized by an alternating current source 22 and having a center tapped secondary winding at 24 to enable full wave rectification. The center tap 24 is connected to ground and the opposite end terminals of the secondary winding are each connected to a different reversely poled diode rectifier, 25 and 26, respectively, whose outputs are connected in common to energize the resistor 20 feeding the base of switching transistor 18. The emitter of transistor 18 is connected to ground whereby at the end of each cycle of the pulsating wave when the base is likewise energized at ground potential, the transistor 18 is switched into conducting condition permitting current flow through its collector to emitter electrodes and thereby short circuiting the rectifier 10 to extinguish conduction therethrough. During remaining portions of the cycle, the base of transistor is properly biased with respect to the emitter to switch off the transistor 18 and maintain the transistor in nonconducting condition.

In addition to extinguishing rectifier 10, the switching transistor 18 also short circuits the capacitor 12 enabling the capacitor 12 to discharge therethrough and be reset to zero potential. In this manner, the ramp voltages at 30 or 31 or 32 (FIG. 2) are reproduced during each cycle of the pulsating wave 33 and the system accordingly rapidly responds to changes in the input voltage received at input resistor 11 once every cycle. Thus, the circuit of the present invention "fires" the rectifier 10 during each cycle of the wave 33 at a different time or different firing angle proportional to the amplitude of the input voltage and extinguishes conduction thereto at the end of each cycle.

For preventing undue surges of power through the control circuits during each cycle wherever the rectifier 10 is "fired," there is provided a storage or bucket capacitor 17 for discharging through the rectifier 10 and load. The capacitor 17 is adapted to be charged through resistor 15 from the power supply during each cycle and to discharge through rectifier 10 to the load upon the rectifier 10 being "fired." The time constant of capacitor 17 and resistor 15 is relatively short during each cycle whereby the capacitor 17 is rapidly charged at the beginning of each cycle and can discharge appreciable energy to the load shortly thereafter.

At the termination of each cycle, any residue charge remaining in the capacitor 17 is discharged through switching transistor 18, thereby to reset capacitor 17 for the next cycle. In this manner, a constant amount of energy is available to the pulsing transformer 21 for each cycle.

The transformer 21 is preferably of a type known as a pulsing transformer for producing large amplitude sharp edged pulses over output lines 27 shortly after the firing instant of rectifier 10. Such transformers are designed to rapidly saturate upon the application of input power to the primary winding thereof and hence provide large amplitude pulses having a steep leading edge and trailing edge.

The voltage controlled firing circuit of the present invention is preferably employed to control the firing interval of a high power silicon control rectifier (not shown) similar in characteristics to control rectifier 10 but capable of handling considerably greater amplitudes of current as required for motor control or other large current applications. For this purpose, the steep edged pulses produced at the output 27 of pulsing transformer 27 are directed to the control electrode of such rectifiers, thereby to very accurately control the firing interval thereof and hence regulate the amount of power supplied to a dynamoelectric motor or other load. Consequently the circuit of the present invention may be considered as a pulse phase shifting circuit capable of accurately producing uniform characteristic impulses at different time instants over substantially the complete cycle of a pulsating wave. Many other applications of the present invention are also considered evident to those skilled in the art.

Although but one preferred embodiment of the invention has been illustrated and described it is believed evident that many changes may be made without departing from the spirit and scope of this invention. Accordingly, this invention is to be considered as limited only by the following claims appended hereto.

What is claimed is:

1. A voltage controlled firing and extinguishing circuit employing a silicon control rectifier having a pair of power electrodes and a trigger control electrode comprising:

an integrating network responsive to an input control voltage for energizing said control electrode with a progressively varying ramp voltage proportional to both the amplitude of the control voltage and its time interval of application.

means including a Zener diode for applying a bias potential to one of said pair of power electrodes, means for applying a direct current energizing voltage to the other of said pair of power electrodes, a regularly repetitively operating short circuiting means including a switching transistor for periodically short circuiting the pair of power electrodes and the integrating network, thereby to both extinguish any conduction between the electrodes at the end of each period and to reset the ramp voltage, and means operating independently of said input control voltage for applying pulsating direct current energization to operate said short circuiting means.

2. In the circuit of claim 1, the addition of a second integrating means having a short time constant for integrating the direct current voltage applied to said power electrode and said short circuiting means repetitively resetting said second integrating means at the end of each period.

3. In the circuit of claim 2, said switching transistor having a base, emitter, and collector electrodes, with the collector-emitter electrodes connected to short circuit said power electrodes and said second integrating means, and said base electrode being periodically energizable to enable conduction between said collector and emitter electrodes.

4. In the circuit of claim 3, said first and second integrating circuits each comprising a series connected resistor and capacitor with the time constant of the first integrator means being many times greater than the second integrating means.

5. A voltage controlled time delayed pulse producing circuit comprising a solid state rectifier having a pair of power electrodes and a control electrode for triggering conduction between said power electrodes, a resistance-capacitance network energizable by a voltage controlling signal for energizing said control electrode with a substantially linear ramp voltage having a relatively long time constant, a voltage bias producing circuit comprising a resistor and Zener diode being energizable to provide a stabilized bias voltage at one of said power electrodes, a second-resistance capacitance network having a short time constant and energizable by a supply voltage for providing a direct current energization of said other power electrode, and a transistor switch means being repetitively energizable by a variable supply voltage for periodically short circuiting the capacitors of said first and second networks to reset the same and periodically short circuiting said power electrodes to extinguish any conduction therebetween.

6. A voltage controlled pulse producing circuit employing solid state power rectifiers having at least a pair of power carrying electrodes and a control electrode for triggering conduction between the power electrodes comprising:

ramp voltage producing means energized by a variable control signal for producing a substantially linearly varying voltage proportional thereto for energizing said control electrode, means for applying power to one of said power electrodes and means for applying a stabilized bias potential to another power electrode thereby to determine the control electrode potential necessary for triggering the rectifier into conduction, and a switching circuit including a switching transistor for repetitively and momentarily short circuiting said power electrodes at equal time intervals thereby to extinguish any conduction between the power electrodes at the end of each interval, said short circuiting means also being connected to said ramp voltage producing means to periodically reset the voltage produced thereby at the end of each said interval.

7. A signal amplitude controlled time delay impulse generator comprising: a control means responsive to the variable amplitude of an input signal for producing a progressively increasing control signal having a rate of increase in proportion to the amplitude of the input signal, a solid state discharge device energized by said control signal to discharge upon the control signal reaching a presettable amplitude, and means for periodically applying and removing a potential source to said discharge device independently of said input signal to periodically extinguish said discharge device in the event it has entered into discharge during the previous cycle, said latter means including a resistance and capacitor energizable by a voltage source to charge the capacitor, and including a transistor switch means energizable by a periodically variable potential source to discharge said capacitor at regular intervals.

References Cited by the Examiner

UNITED STATES PATENTS

| | | | |
|---|---|---|---|
| 2,221,569 | 11/40 | Berkey et al. | 315—340 |
| 2,428,149 | 9/47 | Falk | 315—340 |
| 2,942,160 | 6/60 | Ricketts et al | 328—78 XR |

FOREIGN PATENTS

| | | |
|---|---|---|
| 1,237,802 | 6/60 | France |

OTHER REFERENCES

"Turn-Off Circuits For Controlled Rectifiers," D. V. Jones, Electronics, Aug. 5, 1960, vol. 33, No. 32, pages 52 and 53.

"Accurate Receiver Tuning," R. L. Ives, Electronics, May 27, 1960, page 113.

JOHN W. HUCKERT, *Primary Examiner.*

ARTHUR GAUSS, *Examiner.*